(12) United States Patent
Toyama et al.

(10) Patent No.: US 12,171,071 B2
(45) Date of Patent: Dec. 17, 2024

(54) ELECTRONIC CONTROL DEVICE

(71) Applicant: HITACHI ASTEMO, LTD., Hitachinaka (JP)

(72) Inventors: Masahiro Toyama, Tokyo (JP); Hideyuki Sakamoto, Hitachinaka (JP); Toshiaki Takai, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 280 days.

(21) Appl. No.: 17/780,363

(22) PCT Filed: Oct. 23, 2020

(86) PCT No.: PCT/JP2020/039968
§ 371 (c)(1),
(2) Date: May 26, 2022

(87) PCT Pub. No.: WO2021/106455
PCT Pub. Date: Jun. 3, 2021

(65) Prior Publication Data
US 2022/0408569 A1    Dec. 22, 2022

(30) Foreign Application Priority Data

Nov. 29, 2019  (JP) ................................. 2019-217030

(51) Int. Cl.
*H05K 9/00*       (2006.01)
*H01R 12/72*      (2011.01)
(Continued)

(52) U.S. Cl.
CPC ......... *H05K 5/0069* (2013.01); *H01R 12/722* (2013.01); *H05K 5/0047* (2013.01);
(Continued)

(58) Field of Classification Search
CPC .................................................. H05K 9/0037
See application file for complete search history.

(56) References Cited

U.S. PATENT DOCUMENTS

| 5,392,197 A | 2/1995 | Cuntz et al. |
| 5,867,371 A | 2/1999 | Denzene et al. |

(Continued)

FOREIGN PATENT DOCUMENTS

| DE | 4041071 A1 | 6/1991 |
| EP | 0781085 A1 | 6/1997 |

(Continued)

OTHER PUBLICATIONS

International Search Report with English translation and Written Opinion issued in corresponding international application PCT/JP2020/039968 dated Dec. 22, 2020.

(Continued)

*Primary Examiner* — Hung V Ngo
(74) *Attorney, Agent, or Firm* — Foley & Lardner LLP

(57) ABSTRACT

An electronic control device comprising: a housing having conductivity; a circuit board that is arranged in the housing and has a first electronic component mounted on a mounting surface; an external connection portion that is electrically connected to the circuit board and is connectable to a device outside the housing; and a duplexing member that has conductivity and is arranged between an inner surface of the housing and the mounting surface of the circuit board, in which the duplexing member forms a cutout portion to avoid contact between the duplexing member and the first electronic component, and further forms a partition portion that partitions the external connection portion between the housing and the circuit board.

15 Claims, 14 Drawing Sheets

(51) Int. Cl.
H05K 5/00 (2006.01)
H05K 7/14 (2006.01)
H05K 7/20 (2006.01)

(52) U.S. Cl.
CPC ....... H05K 7/1427 (2013.01); H05K 7/20172 (2013.01); H05K 9/0039 (2013.01)

(56) References Cited

U.S. PATENT DOCUMENTS

| | | | |
|---|---|---|---|
| 2007/0071886 A1 | 3/2007 | Babb et al. | |
| 2008/0151501 A1* | 6/2008 | Takasou | H05K 7/20154 |
| | | | 361/697 |
| 2011/0085317 A1* | 4/2011 | Nagata | H01R 13/6658 |
| | | | 361/818 |
| 2014/0080329 A1* | 3/2014 | Yamanaka | H05K 7/14 |
| | | | 439/76.1 |
| 2015/0305169 A1* | 10/2015 | Wakana | H05K 7/20454 |
| | | | 361/709 |
| 2019/0166731 A1 | 5/2019 | Kuk et al. | |
| 2021/0015008 A1* | 1/2021 | Ohkubo | H05K 5/0047 |
| 2021/0185795 A1 | 6/2021 | Toyama et al. | |
| 2021/0307216 A1* | 9/2021 | Toyama | H05K 5/0217 |
| 2022/0248575 A1* | 8/2022 | Toyama | H05K 9/0033 |
| 2022/0354006 A1* | 11/2022 | Nakamura | H05K 1/181 |
| 2023/0017402 A1* | 1/2023 | Ozaki | H05K 5/0026 |
| 2023/0069331 A1* | 3/2023 | Teranishi | H05K 7/20854 |

FOREIGN PATENT DOCUMENTS

| | | |
|---|---|---|
| GB | 2254193 A | 9/1992 |
| JP | 2005-64266 A | 3/2005 |
| JP | 2005-294627 A | 10/2005 |
| JP | 2009-054701 A | 3/2009 |
| WO | WO-2019/111655 A1 | 6/2019 |

OTHER PUBLICATIONS

Extended European Search Report issued in corresponding European Patent Application No. 20894135.1, dated Oct. 24, 2023 (12 pages).

* cited by examiner

ELECTRONIC CONTROL DEVICE

TECHNICAL FIELD

The present invention relates to an electronic control device.

BACKGROUND ART

Electronic control devices mounted on vehicles and the like are required to have high calculation performance in order to implement a driving assistance system, such as a collision damage reducing brake, automatic driving, and the like. Therefore, an integrated circuit having a high operation frequency is built in the electronic control devices. Accordingly, radio-frequency electromagnetic noise radiated by the electronic control device tends to increase, and this needs to be suppressed to be equal to or less than a reference value defined by a law of each country.

PTL 1 discloses a shield structure in which a plurality of connection portions connecting an inner surface of a housing and a front surface and a back surface of a wiring board is provided in the housing, and the wiring board is sandwiched between the connection portions. According to this shield structure, a noise current generated from an electronic component can be fed back to the wiring board by a small loop since the connection portions are provided.

CITATION LIST

Patent Literature

PTL 1: JP 2005-294627 A

SUMMARY OF INVENTION

Technical Problem

The technique described in PTL 1 has a problem that it is difficult to provide the connection portion in the vicinity of a tall electronic component so that it is difficult to sufficiently suppress radio-frequency electromagnetic noise.

Solution to Problem

Preferably, an electronic control device according to the present invention includes: a housing having conductivity; a circuit board that is arranged in the housing and has a first electronic component mounted on a mounting surface; an external connection portion that is electrically connected to the circuit board and is connectable to a device outside the housing; and a duplexing member that has conductivity and is arranged between an inner surface of the housing and the mounting surface of the circuit board, and the duplexing member forms a cutout portion to avoid contact between the duplexing member and the first electronic component, and further forms a partition portion that partitions the external connection portion between the housing and the circuit board.

Advantageous Effects of Invention

According to the present invention, it is possible to sufficiently suppress radio-frequency electromagnetic noise.

DESCRIPTION OF EMBODIMENTS

Figure 1:
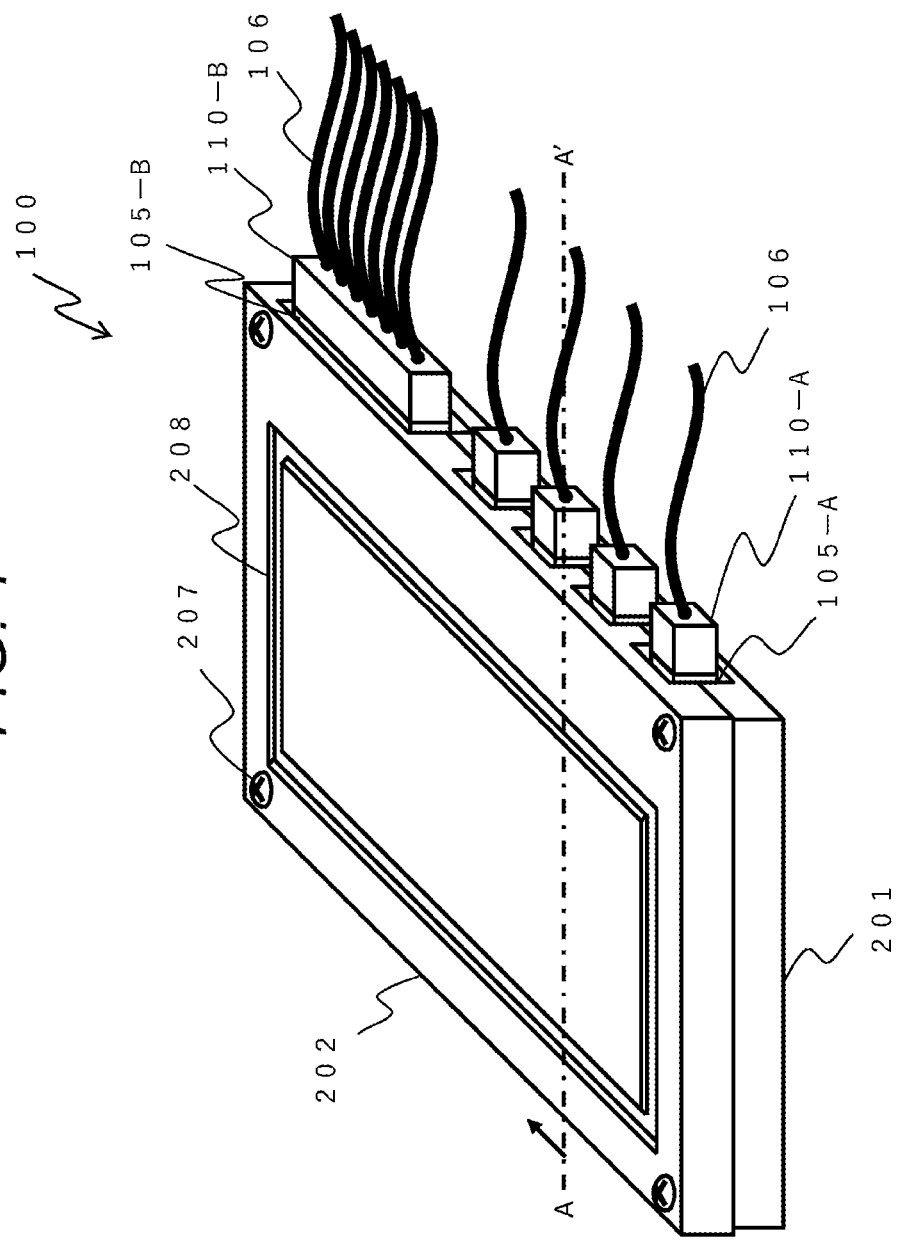
FIG. 1 is an external perspective view of an electronic control device according to a first embodiment.

Hereinafter, embodiments of the present invention will be described with reference to the drawings. The following description and drawings are examples given to describe the present invention, and are appropriately omitted and simplified for clarification of the description. The present invention can be implemented in various other forms. Each constituent element may be singular or plural unless specifically limited.

Positions, sizes, shapes, ranges, and the like of the respective constituent elements illustrated in the drawings do not always indicate actual positions, sizes, shapes, ranges and the like in order to facilitate understanding of the invention. Therefore, the present invention is not necessarily limited to the positions, sizes, shapes, ranges, and the like disclosed in the drawings.

When there is a plurality of constituent elements having the same or similar functions, the same reference sign will be sometimes described with different subscripts. When it is unnecessary to distinguish between the plurality of constituent elements, however, the subscripts will be sometimes omitted in the description.

First Embodiment

Figure 2:
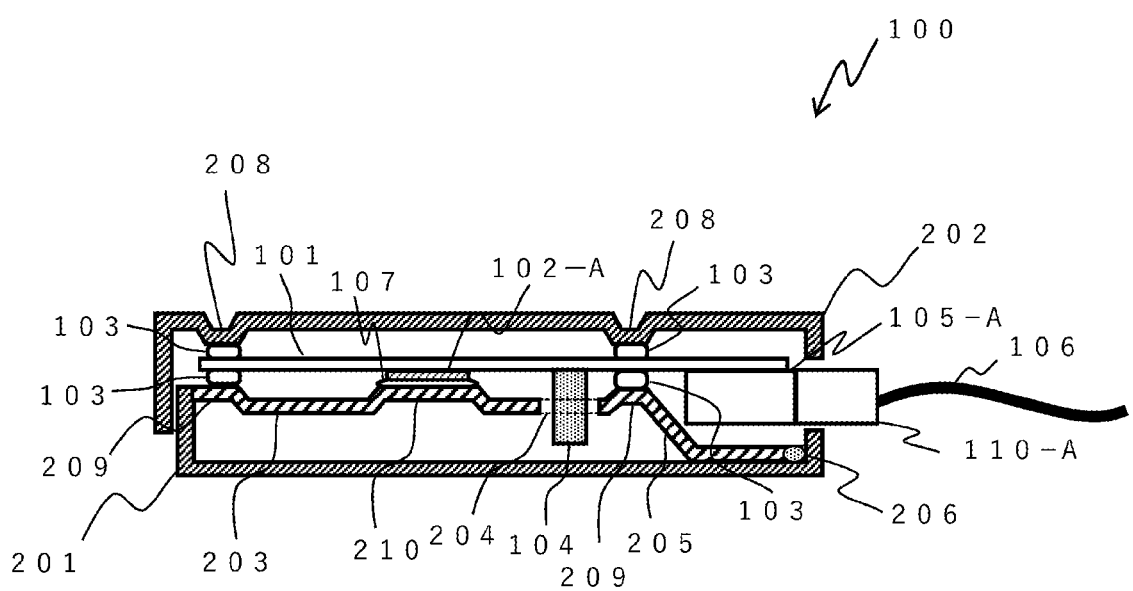
FIG. 2 is a cross-sectional view of the electronic control device according to the first embodiment.
Figure 3:
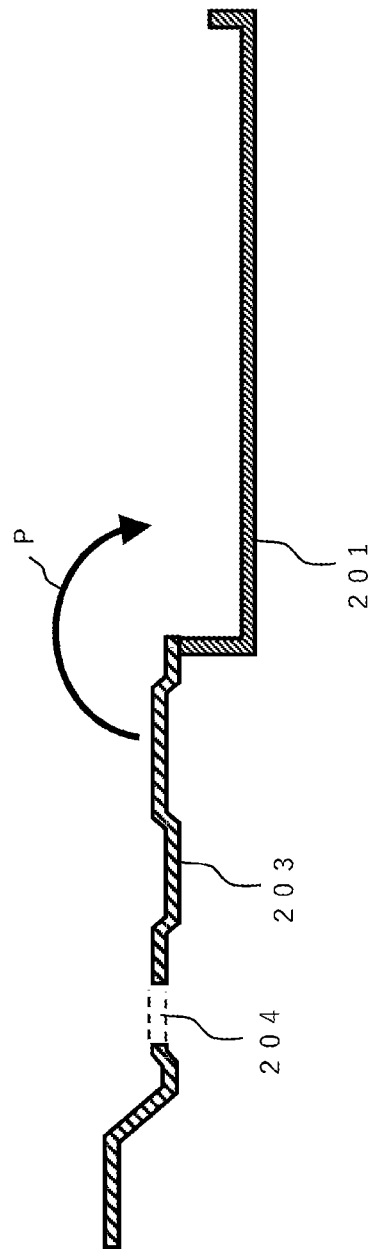
FIG. 3 is a cross-sectional view of a housing of the electronic control device according to the first embodiment before bending.
Figure 4:
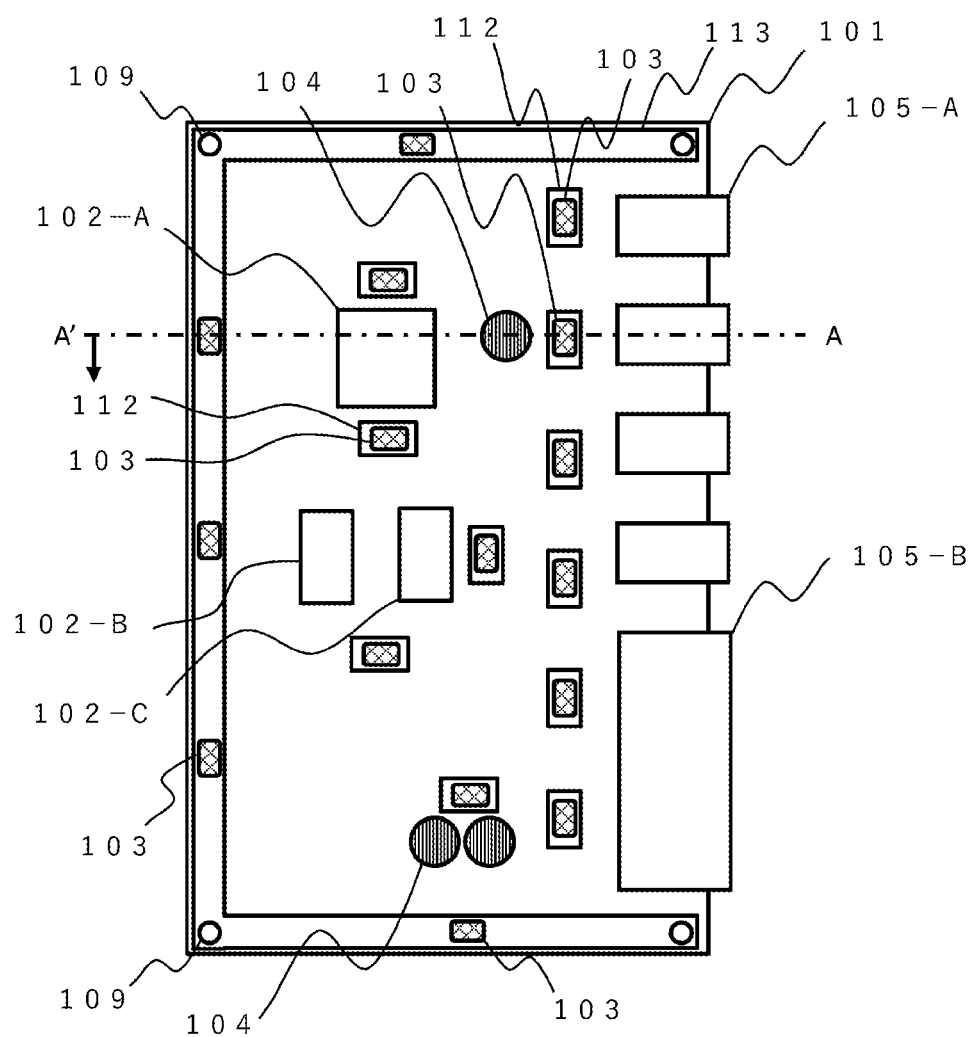
FIG. 4 is a view illustrating a lower surface of a circuit board of the electronic control device according to the first embodiment.
Figure 5:
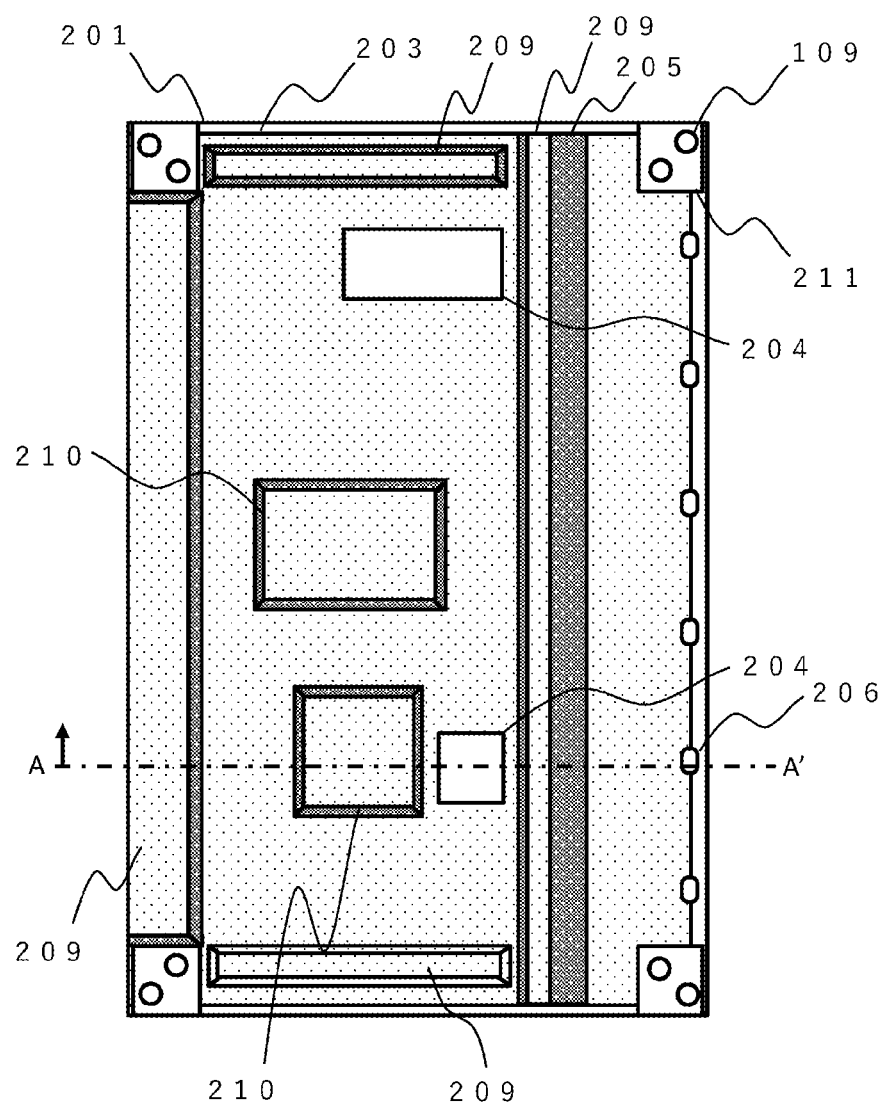
FIG. 5 is a top view of the housing of the electronic control device according to the first embodiment.

A first embodiment will be described with reference to FIGS. 1, 2, 3, 4, and 5. FIG. 1 is an external perspective view of an electronic control device 100 according to the present embodiment; FIG. 2 is a cross-sectional view of the electronic control device 100 according to the present embodiment; FIG. 3 is a cross-sectional view of a housing of the electronic control device 100 according to the present embodiment before bending; FIG. 4 is a lower surface of a circuit board of the electronic control device 100 according to the present embodiment; and FIG. 5 is a top view of the housing of the electronic control device 100 according to the present embodiment. Note that the cross-sectional view of FIG. 2 is a cross-sectional view taken along line A-A' in FIGS. 1, 4, and 5.

As illustrated in FIG. 1, the electronic control device 100 includes a housing 201, and the housing 201 is covered with a housing cover 202. The housing 201 only needs to be a conductive housing, and is obtained, for example, by bonding a conductive sheet to metal, a conductive resin, or a resin. The housing cover 202 is fixed to the housing 201 by screws 207 at four corners of housing 201. The housing cover 202 has a first board connection portion 208 in the periphery of the housing cover 202, and the first board connection portion 208 is electrically connected to a board outer peripheral ground pattern 113 (see FIG. 4 to be described later) on a circuit board 101 (see FIG. 2) in the housing 201.

Cable-side connectors 110-A and 110-B, which are electrically connected to the circuit board 101 (see FIG. 2) in the housing 201 and connectable to external devices are arranged on a side surface of the housing 201. The cable-side connectors 110-A and 110-B are connected to the external devices through cables 106. The cable-side connectors 110-A and 110-B are connected to board-side connectors 105-A and 105-B on the circuit board 101 (see FIG. 2).

As illustrated in FIG. 2, the electronic control device 100 includes the circuit board 101, and an integrated circuit 102-A, an electronic component 104 that is tall, and the connector 105-A are mounted on a lower surface of the circuit board 101. The connector 105-A is connected to the connector 110-A.

A duplexing member 203 is arranged between an inner surface of the housing 201 and a mounting surface of the circuit board 101. The duplexing member 203 only needs to be conductive member, and is obtained, for example, by bonding a conductive sheet to a metal plate, a conductive resin, or a resin. Further, the duplexing member 203 is not limited to a conductive plate material, and may be a conductive mesh-like member. The duplexing member 203 is formed with a cutout portion 204 to avoid contact with the tall electronic component 104. In the present embodiment, the cutout portion 204 is an example of a hole through which a head portion as a part of the electronic component 104 passes. A shape of the hole which is the cutout portion 204 is, for example, a quadrangle, but may be a round shape or other shapes in accordance with a shape of the electronic component 104. Further, the cutout portion 204 is not limited to the hole, and may be a recess in which at least one surface covering a head portion, which is a part of the electronic component 104, is opened as illustrated in a first modification and a second modification to be described later. The hole or the recess with at least one surface opened are collectively referred to as the cutout portion 204.

Further, the duplexing member 203 is connected to an in-board ground pattern 112 (see FIG. 4 to be described later) of the circuit board 101 through electromagnetic wave shield gaskets (EMI gaskets) 103 at a second board connection portion 209. The EMI gasket 103 is an elastic component having conductivity. Note that housing cover 202 is connected to the in-board ground pattern 112 of the circuit board 101 through the EMI gasket 103 at the first board connection portion 208. The duplexing member 203 is connected to the housing 201 by welding or the like at a connection point 206 at an end thereof. Note that the duplexing member 203 may be provided with a rib to improve structural strength.

Further, the duplexing member 203 forms a partition portion 205 that partitions the board-side connector 105-A between the housing 201 and the circuit board 101. Further, the duplexing member 203 is connected to the integrated circuit 102-A through a heat-dissipating member 107, such as heat-dissipating grease, at a heat-dissipating connection portion 210. Heat of the integrated circuit 102-A is conducted from the duplexing member 203 to the housing 201 and dissipated.

As illustrated in FIG. 3, the duplexing member 203 is formed integrally with the housing 201, and the duplexing member 203 is configured by bending the integrally formed housing 201 in a direction of arrow P. In this case, the duplexing member 203 is made of the same conductive member as the housing 201. The duplexing member 203 and the housing 201 are integrally formed by, for example, forming irregularities by sheet metal working of one metal plate and folding the metal plate, so that the number of manufacturing steps is reduced and the degree of freedom in the sheet metal working is improved. In addition, when the metal plate is used, the housing 201 and the duplexing member 203 can be configured in common by an inexpensive metal plate, and there is an effect of cost reduction.

As illustrated in FIG. 4, integrated circuits 102-A, 102-B, and 102-C, the tall electronic component 104, and the board-side connectors 105-A and 105-B are mounted on the lower surface of the circuit board 101. The board outer peripheral ground pattern 113 is arranged on the outer periphery of the circuit board 101, and holes 109 for screwing are provided at four corners of the circuit board 101 and on the board outer peripheral ground pattern 113. Further, the EMI gaskets 103 are provided at predetermined intervals on the board outer peripheral ground pattern 113. The duplexing member 203 is connected to the board outer peripheral ground pattern 113 through the EMI gasket 103.

Furthermore, the in-board ground pattern 112 and the EMI gaskets 103 are arranged around a range of an internal circuit on which the integrated circuits 102-A, 102-B, and 102-C serving as noise sources are mounted. The second board connection portion 209 of the duplexing member 203 is connected to the in-board ground pattern 112 through the EMI gasket 103.

In addition, a plurality of the in-board ground patterns 112 and the EMI gaskets 103 are arranged at predetermined intervals so as to divide a range in which the board-side connectors 105-A and 105-B are mounted and the range of the internal circuit on which the integrated circuits 102-A, 102-B, and 102-C are mounted.

As illustrated in FIG. 5, the duplexing member 203 is arranged on an upper surface of the housing 201, and the duplexing member 203 has the cutout portion 204 formed to correspond to the tall electronic component 104. In addition, the second board connection portion 209 connected to the EMI gasket 103 is provided around the range of the internal circuit on which the integrated circuits 102-A, 102-B, and 102-C serving as the noise sources are mounted.

The duplexing member 203 has the connection point 206 connected to the housing 201 at its end. In addition, the duplexing member 203 forms the partition portion 205 that partitions the connector 105-A between the housing 201 and the circuit board 101. Further, the duplexing member 203 has the heat-dissipating connection portion 210 corresponding to the integrated circuit 102-A. The housing 201 has the screw holes 109 to fix the circuit board 101 with the screws. In this manner, the housing 201 has a structure whose inside is duplexed, and has the duplexing member 203 inside.

(First Modification)

Although the example in which the hole through which the head portion as a part of the electronic component 104 passes is formed in the duplexing member 203 has been described as the cutout portion 204 in the first embodiment, the cutout portion 204 may be a recess that covers the head portion as a part of the electronic component 104 and may have a shape in which one surface of the recess is opened.

Figure 6:
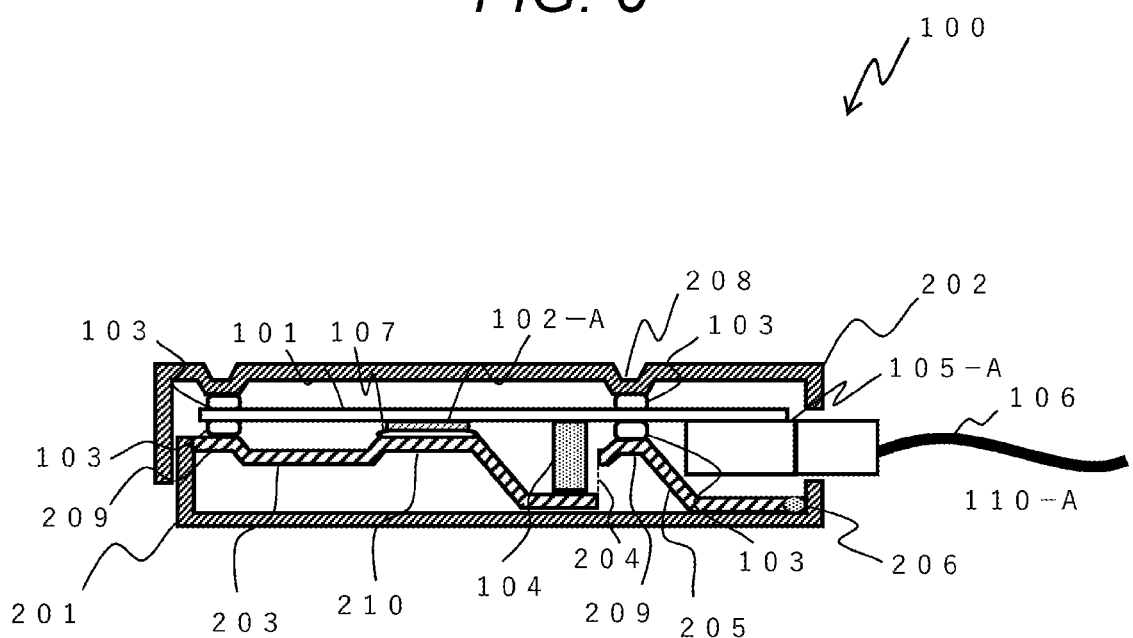
FIG. 6 is a cross-sectional view of a first modification of the electronic control device according to the first embodiment.

FIG. 6 is a cross-sectional view of the electronic control device 100 according to the first modification. The same portions as those in the cross-sectional view of FIG. 2 illustrated in the first embodiment will be denoted by the same reference signs, and the description thereof will be omitted.

As illustrated in FIG. 6, a recess that covers the head portion, which is a part of the electronic component 104, is formed in the duplexing member 203 as the cutout portion 204 in accordance with the tall electronic component 104. Furthermore, the cutout portion 204 has a shape in which one surface (right side in the drawing) of the recess is opened. In this manner, the cutout portion 204 to avoid contact with the tall electronic component 104 may be formed in the duplexing member 203.

(Second Modification)

Although the example in which the hole through which the head portion as a part of the electronic component 104 passes is formed in the duplexing member 203 has been described as the cutout portion 204 in the first embodiment, the cutout portion 204 may be a recess that covers the head portion as a part of the electronic component 104 and may have a shape in which two surfaces of the recess are opened.

Figure 7:
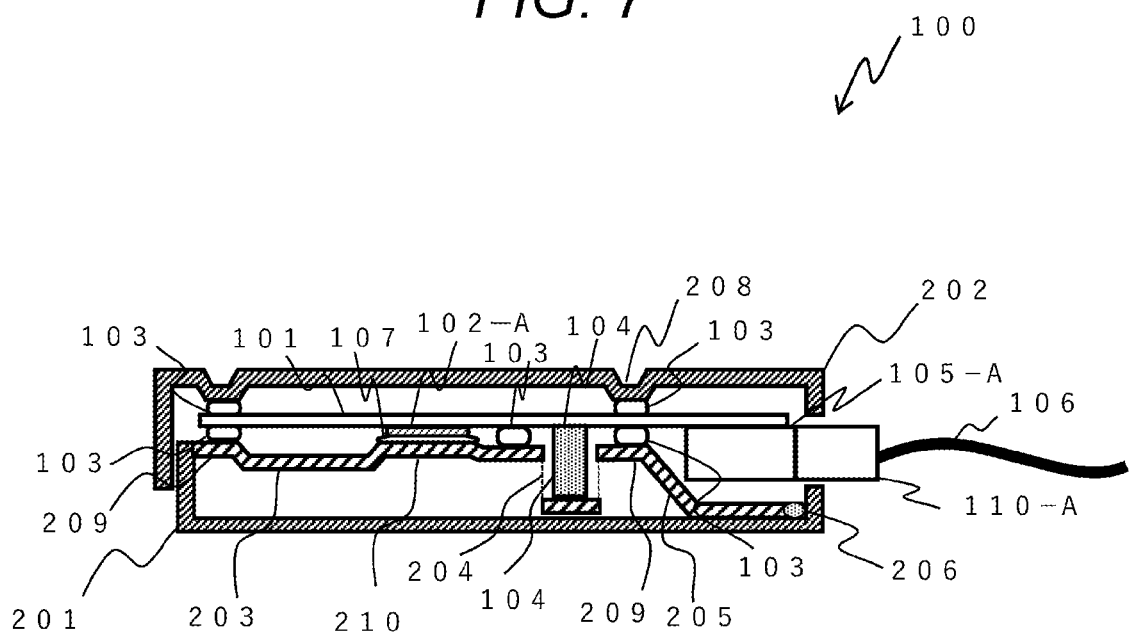
FIG. 7 is a cross-sectional view of a second modification of the electronic control device according to the first embodiment.

FIG. 7 is a cross-sectional view of the electronic control device 100 according to the second modification. The same portions as those in the cross-sectional view of FIG. 2 illustrated in the first embodiment will be denoted by the same reference signs, and the description thereof will be omitted.

As illustrated in FIG. 7, a recess is formed in the duplexing member 203 in accordance with the tall electronic component 104 as the cutout portion 204, and has a shape in which both right and left surfaces (not illustrated) of the recess in the drawing are opened. Note that both front and back surfaces of the recess in the drawing are coupled to the duplexing member 203. In this manner, the cutout portion 204 to avoid contact with the tall electronic component 104 may be formed in the duplexing member 203.

In the present embodiment, the housing 201 has a duplexed structure using the duplexing member 203, and the duplexing member 203 is provided with the cutout portion 204 to avoid the contact with the electronic component 104 on the circuit board 101. Further, the partition portion 205 that partitions the connector 105-A portion is formed in the duplexing member 203. According to the present embodiment, the contact with the tall electronic component 104 is avoided, the integrated circuits 102-A to 102-C as the noise sources and a noise source generated by a peripheral pattern thereof are confined to suppress unnecessary electromagnetic radiation flowing into or out from a portion of the board connector 105-A. Furthermore, the inside of the housing 201 has the duplex structure using the duplexing member 203, and thus, noise can be more completely confined, unnecessary electromagnetic radiation can be suppressed, and the housing strength can be also improved.

Second Embodiment

Figure 8:
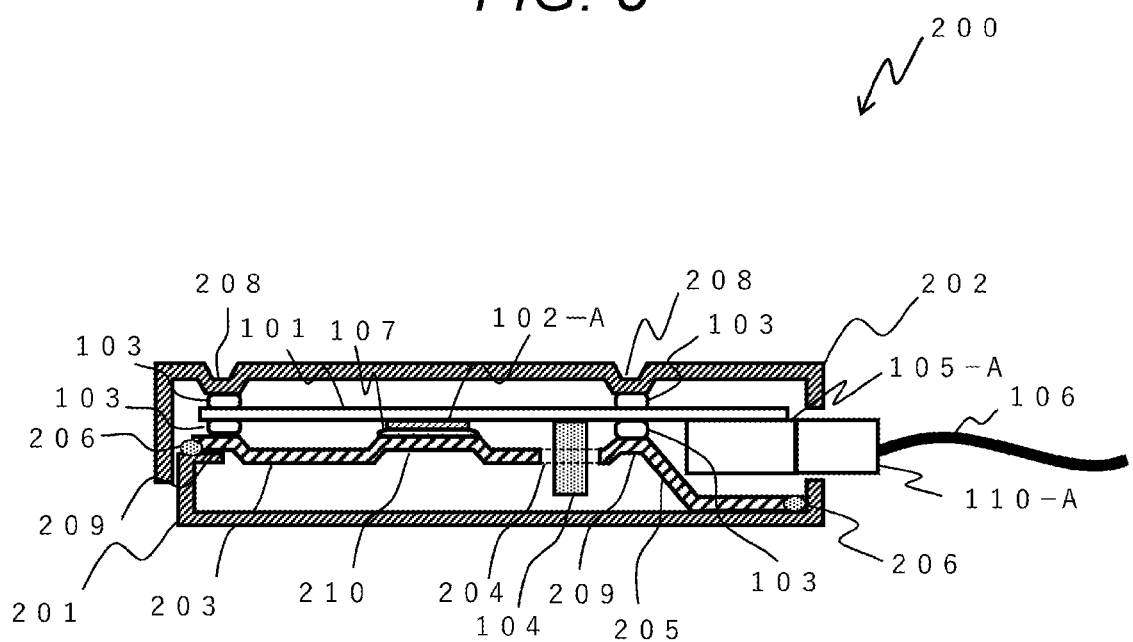
FIG. 8 is a cross-sectional view of an electronic control device according to a second embodiment.

FIG. 8 is a cross-sectional view of an electronic control device 200 according to the present embodiment. Note that an external perspective view of the electronic control device 200 is similar to FIG. 1 illustrated in the first embodiment. In addition, a lower surface of a circuit board of the electronic control device 200 is similar to that of FIG. 4 illustrated in the first embodiment.

Although the duplexing member 203 of the housing 201 is formed by folding the housing 201 in the first embodiment, a separate member from the housing 201 is used as the duplexing member 203 in the present embodiment.

As illustrated in FIG. 8, the duplexing member 203 is connected to the housing 201 by welding at connection points 206 at both ends thereof. Although the example in which connection is made by welding has been described in the present embodiment, a mode may be adopted in which the duplexing member 203 is fixed to the housing 201 by a screw or a fitting structure.

The other configurations, a material, and the like of the duplexing member 203 are the same as those described in the first embodiment, and thus, the description thereof will be omitted.

According to the present embodiment, an effect of reducing the development cost can be obtained by producing the housing 201 inexpensively as a common member for a plurality of electronic control devices and individually designing the duplexing members 203 in accordance with the arrangement of components on the circuit board 101 different for each of the electronic control devices.

Third Embodiment

Figure 9:
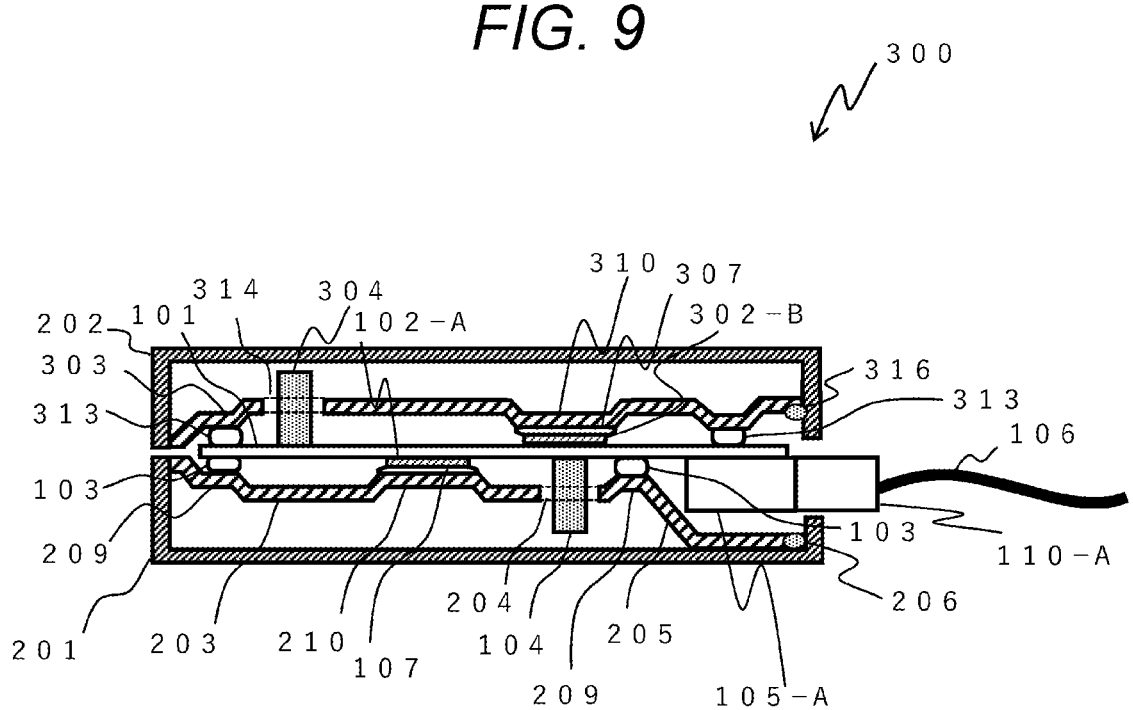
FIG. 9 is a cross-sectional view of an electronic control device according to a third embodiment.

FIG. 9 is a cross-sectional view of an electronic control device 300 according to the present embodiment. Note that a lower surface of a circuit board of the electronic control device 300 is similar to that in FIG. 4 illustrated in the first embodiment, and a top view of a housing of the electronic control device 300 is similar to that in FIG. 5 illustrated in the first embodiment.

Although the example in which the electronic component 104 and the like are mounted on the lower surface of the circuit board 101 has been described in the first embodiment, the present embodiment is different from the first embodiment in that an electronic component 304 and the like are also mounted on an upper surface of the circuit board 101, and a duplexing member 303 is arranged thereon.

As illustrated in FIG. 9, in the electronic control device 300, an integrated circuit 302-B and the electronic component 304 that is tall are mounted on the upper surface of the circuit board 101, and the duplexing member 303 is arranged between the housing cover 202 and the circuit board 101. The duplexing member 303 is connected to a board ground of the circuit board 101 through an EMI gasket 313. The duplexing member 303 is provided with a cutout portion 314 such as a hole through which a head portion as a part of the tall electronic component 304 passes. Further, the duplexing member 303 is connected to the integrated circuit 302-B through a heat-dissipating member 307, such as heat-dissipating grease, at a heat-dissipating connection portion 310. The duplexing member 303 is connected to the housing cover 202 at an end thereof by a connection point 316 obtained by welding or the like.

The other configurations, a material, and the like of the duplexing member 303 are similar to those of the duplexing member 203 described in the first embodiment, and thus, the description thereof will be omitted. Note that a connector may be arranged on the upper surface of the circuit board 101 although not illustrated. In this case, the duplexing member 303 forms a partition portion that partitions the connector between the housing cover 202 and the circuit board 101.

According to the present embodiment, the duplexing member 303 and the tall electronic component 304 can be arranged not only on the housing 201 side but also on the housing cover 202 side, so that the electronic control device can be downsized by the high-density arrangement in addition to the effects described in the first embodiment.

Fourth Embodiment

Figure 10:
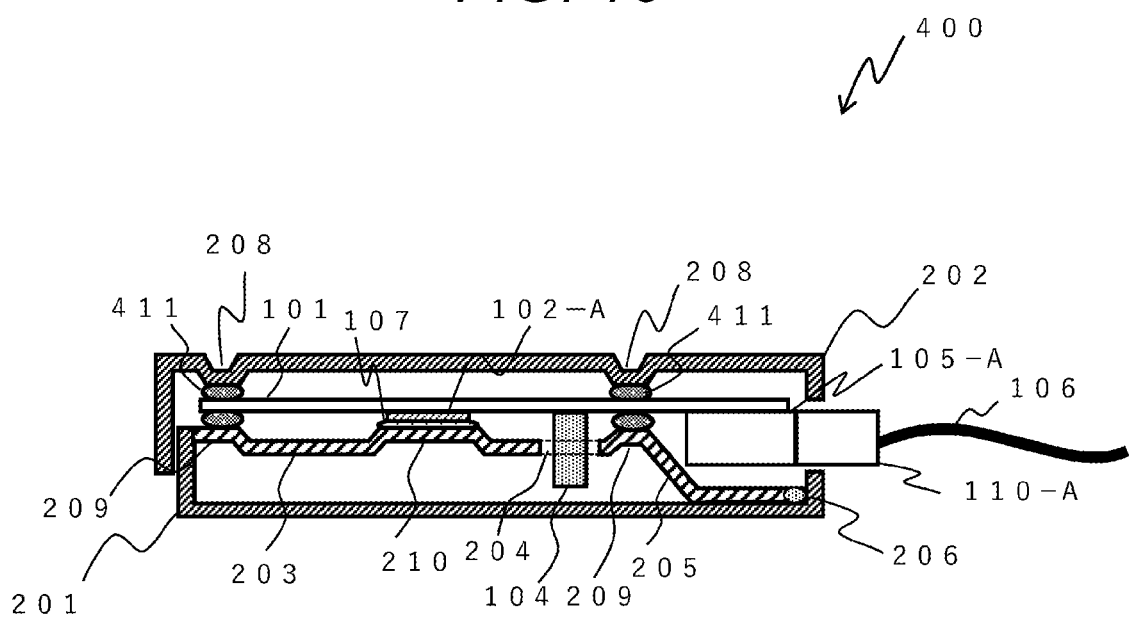
FIG. 10 is a cross-sectional view of an electronic control device according to a fourth embodiment.

FIG. 10 is a cross-sectional view of an electronic control device 400 according to the present embodiment. Note that an external perspective view of the electronic control device 400 is similar to FIG. 1 illustrated in the first embodiment. In addition, a lower surface of a circuit board of the electronic control device 400 is similar to that in FIG. 4 illustrated in the first embodiment, and a top view of a housing of the electronic control device 400 is similar to that in FIG. 5 illustrated in the first embodiment.

Although the EMI gasket 103 is used in the first embodiment, the present embodiment is different in that a dielectric material 411 is used.

As illustrated in FIG. 10, the circuit board 101 and the housing cover 202 are connected by capacitive coupling using the dielectric material 411 at the first board connection portion 208. Further, the circuit board 101 and the housing 201 are connected by capacitive coupling using the dielectric material 411 at the second board connection portion 209. The dielectric material 411 may be the same as the heat-dissipating grease used for the heat-dissipating member 107, or may use a silicone-based adhesive used in a formed in place gasket (FIPG) method or the like.

Note that configurations, a material, and the like of the duplexing member 203 are similar to those of the duplexing member 203 described in the first embodiment, and thus, the description thereof will be omitted.

According to the present embodiment, it is only necessary to apply the dielectric material 411 in a manufacturing step, and thus, manufacturing can be performed at a lower cost than that in the case of assembling the EMI gasket 103.

Fifth Embodiment

Figure 11:
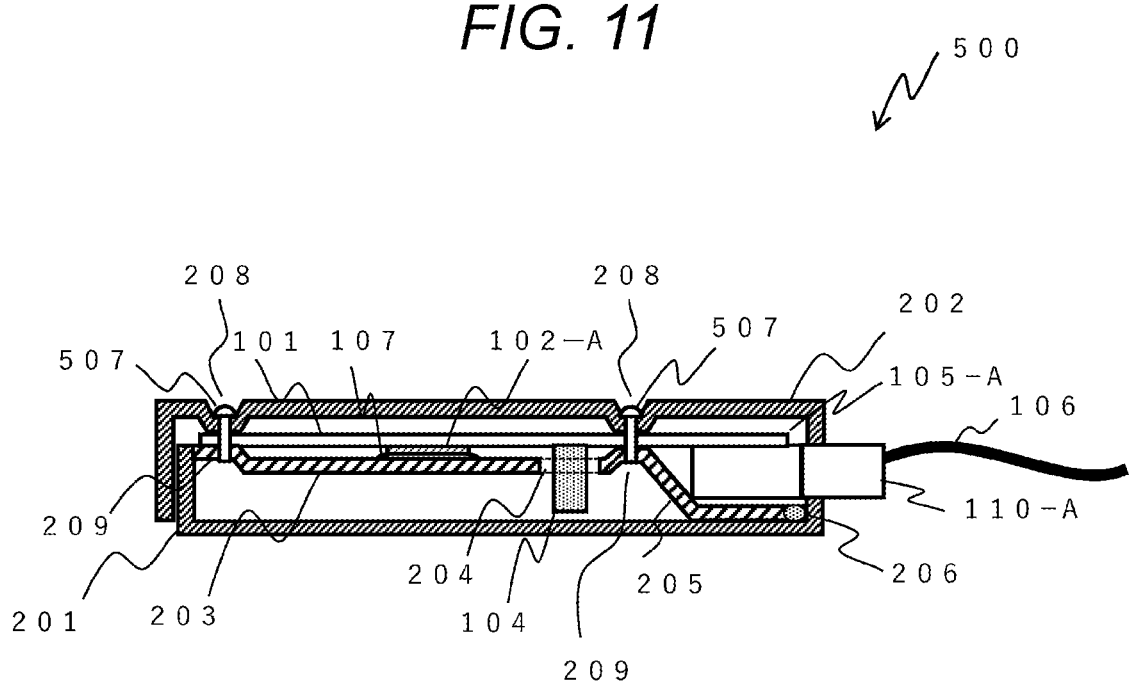
FIG. 11 is a cross-sectional view of an electronic control device according to a fifth embodiment.

FIG. 11 is a cross-sectional view of an electronic control device 500 according to the present embodiment. Note that an external perspective view of the electronic control device 500 is similar to FIG. 1 illustrated in the first embodiment. In addition, a lower surface of a circuit board of the electronic control device 500 is similar to that in FIG. 4 illustrated in the first embodiment, and a top view of a housing of the electronic control device 500 is similar to that in FIG. 5 illustrated in the first embodiment.

Although the EMI gasket 103 is used in the first embodiment, the present embodiment is different in that a screw 507 or the like is used.

As illustrated in FIG. 11, a ground of the circuit board 101 and the housing cover 202 are mechanically and electrically connected using a mechanical connection member such as the screw 507 at the first board connection portion 208. Further, the ground of the circuit board 101 and the duplexing member 203 are mechanically and electrically connected using a mechanical connection member such as the screw 507 at the second board connection portion 209.

Note that configurations, a material, and the like of the duplexing member 203 are similar to those of the duplexing member 203 described in the first embodiment, and thus, the description thereof will be omitted.

According to the present embodiment, the housing cover 202, the circuit board 101, and the duplexing member 203 are firmly fixed, so that vibration resistance of the electronic control device 500 can be improved.

Sixth Embodiment

Figure 12:
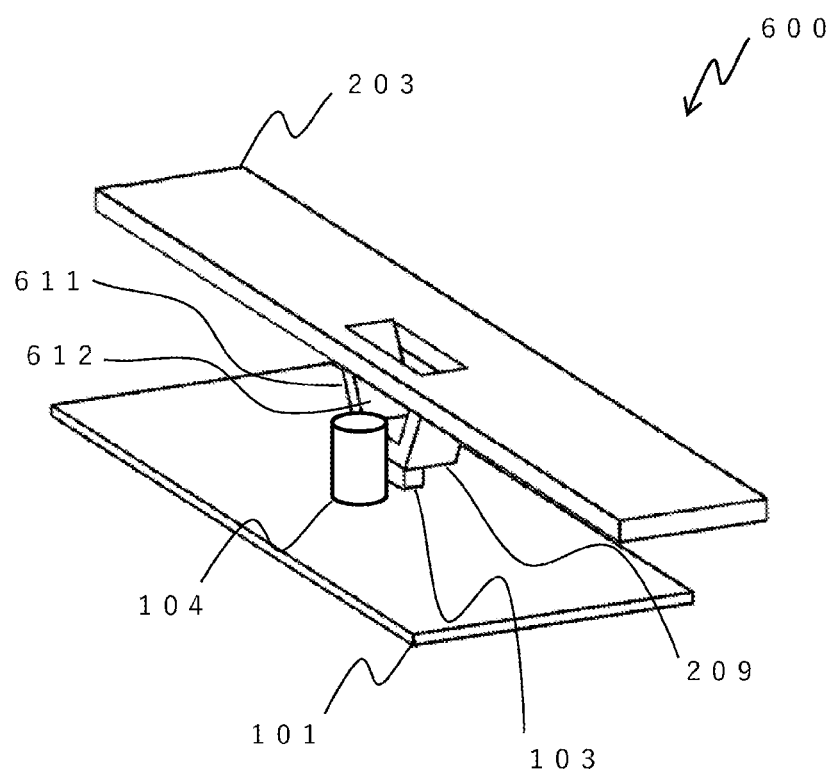
FIG. 12 is a perspective view illustrating a second board connection portion of an electronic control device according to a sixth embodiment.

FIG. 12 is a perspective view illustrating the second board connection portion 209 of an electronic control device 600 according to the present embodiment. Note that an external perspective view of the electronic control device 600 is similar to FIG. 1 illustrated in the first embodiment. In addition, a lower surface of a circuit board of the electronic control device 600 is similar to that of FIG. 4 illustrated in the first embodiment. Note that FIG. 12 is a vertically inverted view as compared with the cross-sectional view of FIG. 2 illustrated in the first embodiment.

Although the cutout portion 204, such as a hole, is formed in the duplexing member 203 to correspond to the tall electronic component 104 in the first embodiment, the present embodiment is different in that a cutout portion 611 is formed in the duplexing member 203 to correspond to the second board connection portion 209, and the cutout portion 611 is arranged in the vicinity of the tall electronic component 104.

As illustrated in FIG. 12, the second board connection portion 209 is provided in the vicinity of the tall electronic component 104. The second board connection portion 209 has the cutout portion 611 in which the duplexing member 203 protrudes toward the circuit board 101. The cutout portion 611 is connected to the duplexing member 203 and the in-board ground pattern 112 of the circuit board 101 through the EMI gasket 103. Furthermore, the cutout portion 611 is provided with a gap 612 on a side close to the electronic component 104. Accordingly, the second board connection portion 209 can be arranged in the vicinity of the tall electronic component 104. That is, it is possible to avoid a problem that the tall electronic component 104 and the duplexing member 203 come into contact with each other due to restriction of an aperture angle in molding of the duplexing member 203.

The other configurations, a material, and the like of the duplexing member 203 are similar to those of the duplexing member 203 described in the first embodiment, and thus, the description thereof will be omitted. In addition, the example in which the EMI gasket 103 is used has been described in the present embodiment, but a mechanical connection member such as the dielectric material 411 described in the fourth embodiment or the screw 507 described in the fifth embodiment may be used.

In the first embodiment, the cutout portion 204, such as a hole, is provided so as to avoid the contact with the tall electronic component 104 in a state where the circuit board 101 and the duplexing member 203 are close to each other. On the other hand, the present embodiment adopts a configuration in which the cutout portion 611 is provided to correspond to the second board connection portion 209 so as to avoid contact with the tall electronic component 104 in a state where the circuit board 101 and the duplexing member 203 are separated from each other. Note that the cutout portion 204 described in the first embodiment and the cutout portion 611 described in the present embodiment may be formed together in the duplexing member 203.

According to the present embodiment, the duplexing member 203 and the circuit board 101 can be connected even in the vicinity of the tall electronic component 104, and the degree of freedom in designing the duplexing member 203 is improved. In addition, a noise source can be confined to suppress unnecessary electromagnetic radiation.

Seventh Embodiment

Figure 13:
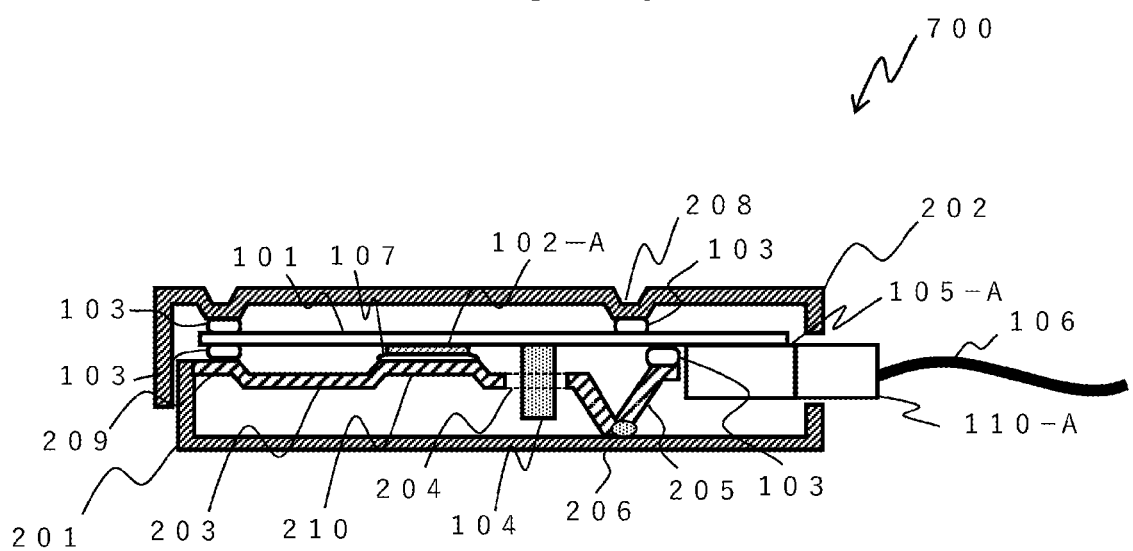
FIG. 13 is a cross-sectional view of an electronic control device according to a seventh embodiment.

FIG. 13 is a cross-sectional view of an electronic control device 700 according to the present embodiment. Note that an external perspective view of the electronic control device 700 is similar to FIG. 1 illustrated in the first embodiment. In addition, a lower surface of a circuit board of the electronic control device 700 is similar to that of FIG. 4 illustrated in the first embodiment.

In the electronic control device 700 according to the present embodiment, the partition portion 205 of the duplexing member 203 is different from that of the first embodiment.

As illustrated in FIG. 13, the partition portion 205 of the duplexing member 203 is connected to the in-board ground pattern 112 of the circuit board 101 through the EMI gasket 103 on the board-side connector 105-A side, and is connected to the housing 201 by welding or the like at the connection point 206 of the duplexing member 203.

The other configurations, a material, and the like of the duplexing member 203 are the same as those described in the first embodiment, and thus, the description thereof will be omitted.

According to the present embodiment, the connection between the housing 201 and a ground of the circuit board 101 can be provided very close to the connector 105-A, and thus, it is possible to arrange a circuit pattern to the vicinity of the connector 105-A while securing the shielding performance for suppressing unnecessary electromagnetic radiation.

Eighth Embodiment

Figure 14:
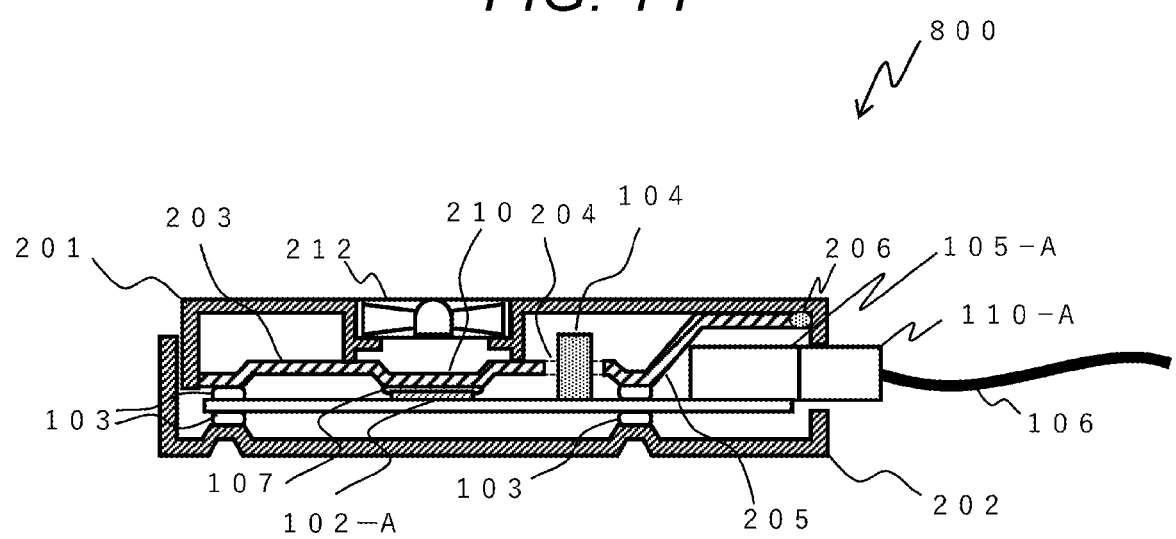
FIG. 14 is a cross-sectional view of an electronic control device according to an eighth embodiment.

FIG. 14 is a cross-sectional view of an electronic control device 800 according to the present embodiment. Note that an external perspective view of the electronic control device 800 is similar to FIG. 1 illustrated in the first embodiment. In addition, a lower surface of a circuit board of the electronic control device 800 is similar to that in FIG. 4 illustrated in the first embodiment, and a top view of a housing of the electronic control device 800 is similar to that in FIG. 5 illustrated in the first embodiment. Note that FIG. 14 is a vertically inverted view as compared with the cross-sectional view of FIG. 2 illustrated in the first embodiment.

The present embodiment is different from the first embodiment in that the housing 201 incorporates a cooling fan 212.

As illustrated in FIG. 14, the duplexing member 203 is connected to the integrated circuit 102-A through the heat-dissipating member 107, such as heat-dissipating grease, at the heat-dissipating connection portion 210. The cooling fan 212 is incorporated in the housing 201 so as to face heat-dissipating connection portion 210. Heat of the integrated circuit 102-A is conducted to the duplexing member 203 and cooled by the cooling fan 212. Note that the example in which the cooling fan 212 is installed in the housing 201 has been described, but the cooling fan may be installed in the duplexing member 203 so as to face the heat-dissipating connection portion 210. Further, a cooling member, such as a heat-dissipating fin, may be provided in the housing 201 or the duplexing member 203 to correspond to the heat-dissipating connection portion 210 without being limited to the cooling fan 212.

Note that configurations, a material, and the like of the duplexing member 203 are similar to those of the duplexing member 203 described in the first embodiment, and thus, the description thereof will be omitted.

According to the present embodiment, it is possible to further improve the heat-dissipating efficiency while securing the shielding performance for suppressing unnecessary electromagnetic radiation.

According to the above-described embodiments, the following operational effects are obtained.

(1) The electronic control device 100, 200, 300, 400, 500, 600, 700, or 800 includes: the conductive housing 201; the circuit board 101 that is arranged in the housing 201 and has the electronic component 304 mounted on the mounting surface; the connectors 105-A, 105-B, 110-A, and 110-B electrically connected to the circuit board 101 and connectable to devices outside the housing 201; the conductive duplexing member 203 or 303 arranged between the inner surface of the housing 201 and the mounting surface of the circuit board 101; the duplexing member 203 or 303 forms the cutout portion 204, 314, or 611 to avoid the contact between the duplexing member 203 or 303 and the electronic component 304, and further forms the partition portion 205 that partitions the connectors 105-A, 105-B, 110-A, and 110-B between the housing 201 and the circuit board 101. This makes it possible to sufficiently suppress radio-frequency electromagnetic noise.

The present invention is not limited to the above-described embodiments, and other modes, which are conceivable inside a scope of a technical idea of the present invention, are also included in a scope of the present invention as long as characteristics of the present invention are not impaired. In addition, the invention may be configured by combining the respective embodiments.

The disclosed content of the following priority application is incorporated herein as the citation.

Japanese Patent Application No. 2019-217030 (filed on-Nov. 29, 2019)

REFERENCE SIGNS LIST 101 circuit board
102-A to 102-C, 302-B integrated circuit
103, 313 EMI gasket
104, 304 electronic component
105-A, 105-B board-side connector
106 cable
107, 307 heat-dissipating member
109 hole for screwing
110-A, 110-B cable-side connector
111 dielectric material
112 in-board ground pattern
113 board outer peripheral ground pattern
201 housing
202 housing cover
203, 303 duplexing member
204, 314, 611 cutout portion
205 partition portion
206, 316 connection point
207 screw
208 first board connection portion
209 second board connection portion
210, 310 heat-dissipating connection portion 211 notch for avoiding component interference
212 cooling fan
100, 200, 300, 400, 500, 600, 700, 800 electronic control device

The invention claimed is:

1. An electronic control device comprising:
a housing having conductivity;
a circuit board that is arranged in the housing and has a first electronic component mounted on a mounting surface;
an external connection portion that is electrically connected to the circuit board and is connectable to a device outside the housing; and
a duplexing member that has conductivity and is arranged between an inner surface of the housing and the mounting surface of the circuit board, wherein the duplexing member is (i) connected to a first portion of the housing through the circuit board and at least one connection structure that is electrically conductive or capacitive, and (ii) the duplexing member is also connected to a second portion of the housing opposite to the first portion,
wherein the duplexing member forms a cutout portion to avoid contact between the duplexing member and the first electronic component, and further forms a partition portion that partitions the external connection portion between the housing and the circuit board.

2. The electronic control device according to claim 1, wherein the cutout portion is a hole through which a part of the first electronic component passes, or a recess in which at least one surface covering a part of the first electronic component is opened.

3. The electronic control device according to claim 1, wherein the cutout portion allows the duplexing member to protrude toward the circuit board and be connected to the circuit board in a vicinity of the first electronic component, and has a gap on a side of the first electronic component.

4. The electronic control device according to claim 3, wherein a dielectric material is used for an electrical connection between the duplexing member and a ground of the circuit board.

5. The electronic control device according to claim 3, wherein a mechanical connection member is used to electrically connect the duplexing member and a ground of the circuit board.

6. The electronic control device according to claim 1, wherein the cutout portion electrically connects a ground around the first electronic component on the circuit board and the duplexing member.

7. The electronic control device according to claim 1, wherein the partition portion is electrically connected to a ground of the circuit board and the housing.

8. The electronic control device according to claim 7, wherein the partition portion is connected to the ground of the circuit board on the circuit board on a side close to the external connection portion.

9. The electronic control device according to claim 1, wherein a ground of an outer peripheral portion of the circuit board and the duplexing member are electrically connected.

10. The electronic control device according to claim 1, wherein the duplexing member and a second electronic component mounted on the circuit board are connected through a heat-dissipating member.

11. The electronic control device according to claim 10, wherein a cooling member is incorporated in the housing or the duplexing member, and the duplexing member to which the second electronic component is connected is cooled by the cooling member.

12. The electronic control device according to claim 11, wherein the cooling member is a cooling fan.

13. The electronic control device according to claim 1, wherein the duplexing member is formed integrally with the housing, and the duplexing member is formed by bending the housing.

14. The electronic control device according to claim 1, wherein the duplexing member is formed separately from the housing, and the duplexing member is connected to the housing at an end portion of the housing.

15. The electronic control device according to claim 1, wherein the duplexing member is arranged between the housing and the circuit board on both an upper surface and a lower surface of the circuit board.

* * * * *